(12) United States Patent
Kong et al.

(10) Patent No.: US 9,659,905 B2
(45) Date of Patent: May 23, 2017

(54) SEMICONDUCTOR PACKAGE AND SEMICONDUCTOR SYSTEM INCLUDING THE SAME

(71) Applicant: SK hynix Inc., Icheon-si, Gyeonggi-do (KR)

(72) Inventors: Kyu Bong Kong, Suwon-si (KR); Kwang Jin Na, Seoul (KR)

(73) Assignee: SK hynix Inc., Icheon-si (KR)

( * ) Notice: Subject to any disclaimer, the term of this patent is extended or adjusted under 35 U.S.C. 154(b) by 22 days.

(21) Appl. No.: 14/668,527

(22) Filed: Mar. 25, 2015

(65) Prior Publication Data

US 2016/0147250 A1     May 26, 2016

(30) Foreign Application Priority Data

Nov. 24, 2014 (KR) .......... 10-2014-0164375

(51) Int. Cl.
| | |
|---|---|
| *G11C 7/00* | (2006.01) |
| *H01L 25/065* | (2006.01) |
| *G11C 8/18* | (2006.01) |
| *G11C 29/02* | (2006.01) |
| *G11C 7/10* | (2006.01) |
| *H01L 25/18* | (2006.01) |

(52) U.S. Cl.
CPC ........ *H01L 25/0655* (2013.01); *G11C 7/1066* (2013.01); *G11C 7/1093* (2013.01); *G11C 8/18* (2013.01); *G11C 29/023* (2013.01); *G11C 29/028* (2013.01); *G11C 2207/2254* (2013.01); *H01L 25/18* (2013.01); *H01L 2924/0002* (2013.01)

(58) Field of Classification Search
CPC ......... G06F 1/08; G06F 1/12; H01L 25/0655; H01L 25/18
See application file for complete search history.

(56) References Cited

U.S. PATENT DOCUMENTS

| | | | |
|---|---|---|---|
| 8,437,216 B2 | 5/2013 | Oh et al. | |
| 2011/0208916 A1 | 8/2011 | Saito | |
| 2014/0192583 A1* | 7/2014 | Rajan | ....................... G11C 7/10 365/63 |

* cited by examiner

*Primary Examiner* — Richard Elms
*Assistant Examiner* — Mohammed A Bashar
(74) *Attorney, Agent, or Firm* — William Park & Associates Ltd.

(57) ABSTRACT

A semiconductor package may include a first die, a second die disposed adjacent to the first die, and configured to share an address with the first die. The semiconductor package may include a first address pin included with the first die, and configured for receiving the address. The semiconductor package may include a second address pin included with the second die, and configured for receiving the address. The first die and the second die may output data corresponding to the address. Timings of the address in the first die and the second die may be aligned according to delay signals applied from a controller.

17 Claims, 6 Drawing Sheets

SEMICONDUCTOR PACKAGE AND SEMICONDUCTOR SYSTEM INCLUDING THE SAME

CROSS-REFERENCES TO RELATED APPLICATION

The present application claims priority under 35 U.S.C. §119(a) to Korean application number 10-2014-0164375, filed on Nov. 24, 2014, in the Korean Intellectual Property Office, which is incorporated herein by reference in its entirety.

BACKGROUND

1. Technical Field

Various embodiments generally relate to a semiconductor package and a semiconductor system including the same, and more particularly, to a technology for improving a training precision in a dual die package (DDP) that shares pins.

2. Related Art

Semiconductor memory devices are being developed to increase the degree of integration and the operating speeds of the semiconductor memory devices. In order to increase the operating speeds of the semiconductor memory devices, a synchronous memory device has been developed. This synchronous memory device is capable of operating in synchronization with a clock signal received from outside a memory chip.

For example, an SDR (single data rate) synchronous memory device may use a single data pin to input and output data during a single clock cycle. In the SDR synchronous memory device, the input and output of the data is in synchronization with the rising edge of a clock signal.

However, the SDR synchronous memory device has difficulty in operating with systems which require high speed operations. Accordingly, a DDR (double data rate) synchronous memory device may be implemented. In a DDR synchronous memory device data is consecutively inputted and outputted through each data input/output pin, in synchronization with the rising edge and the falling edge of a clock signal.

As such, a bandwidth at least two times wider than the conventional SDR synchronous memory device may be realized without increasing the frequency of a clock signal, and thus, a high speed operation may be achieved.

Semiconductor devices are being designed to consume less power.

In particular, a memory for a high speed operation (for example, the Graphics Double Data Rate version 5 (GDDR5)) is being designed. The memory for the high speed operation may be capable of receiving addresses at not only the rising edge but also the falling edge of an external clock. Since it is possible to receive addresses twice for every one cycle, the number of address pins may be decreased in comparison to the conventional semiconductor memory device. An extra number of pins may be connected with a power supply voltage or a ground voltage to increase the operation speed of the semiconductor memory device.

In a semiconductor memory device such as a dynamic random access memory (DRAM), in order to achieve a larger capacity from a unit area, a plurality of semiconductor chips (or dies) may be stacked and then packaged.

A semiconductor memory device including only one semiconductor chip, packaged, is referred to as a single die package (SDP). Also, a semiconductor memory device including two semiconductor chips, stacked and packaged, is referred to as a dual die package (DDP). Further, a semiconductor memory device including four semiconductor chips, stacked and packaged, is referred to as a quad die package (QDP).

In a semiconductor device, in order to optimize an address setup/hold time, an address training operation for sweeping an address timing may be performed.

As the operating speed of a semiconductor device is increased and the cycle of a clock is shortened, alignment of operation timings among various commands, addresses and data applied to a memory device by a controller is regarded as an important factor for improving operational stability and precision.

In particular, in the case of a memory device requiring a substantially high data input/output speed, in order to prevent occurrence of an error, it is necessary to precisely align data input/output timings between a memory controller and a memory device.

In the case of a dual die package (DDP) having two dies are packaged into one, internal/external chip circumstances, that is, PVT (process, voltage and temperature) conditions may be different in the two dies.

That is to say, in the dual die package, two dies share address and command pins, but memory core regions in the respective dies operate separately from each other. Therefore, since the optimization timings of address setup/hold times are different according to PVT conditions in two dies, a training time is lengthened and the precision of the package may be degraded.

SUMMARY

In an embodiment, a semiconductor package may include a first die; a second die disposed adjacent to the first die, and configured to share an address with the first die. The semiconductor package may include a first address pin included with the first die, and configured for receiving the address. The semiconductor package may include a second address pin included with the second die, and configured for receiving the address. The first die and the second die may output data corresponding to the address. Timings of the address in the first die and the second die may be aligned according to delay signals applied from a controller.

In an embodiment, a semiconductor system may include a semiconductor package including a first die and a second die, the first die and the second die configured to output data corresponding to an address and share the address. The semiconductor system may include a controller configured to output the address to the semiconductor package, receive the data, and output delay signals for aligning address timings of the first die and the second die. The second die may be disposed adjacent to the first die.

In an embodiment, a semiconductor system may include a semiconductor package including a first die including a first address pin and a second die including a second address pin. The first and second address pins may be configured to receive an address. The first die and the second die may output data corresponding to the address. Timings of the address in the first die and the second die may be aligned according to delay signals received by the semiconductor package.

DETAILED DESCRIPTION

Hereinafter, a semiconductor package and a semiconductor system including the same will be described below with reference to the accompanying drawings through various examples of embodiments.

Various embodiments may be directed to the improvement of training to increase precision within a dual die package (DDP) having address and command pins shared. According to various embodiments, a training precision may be improved in a dual die package (DDP) having address and command pins are shared.

Figure 1:
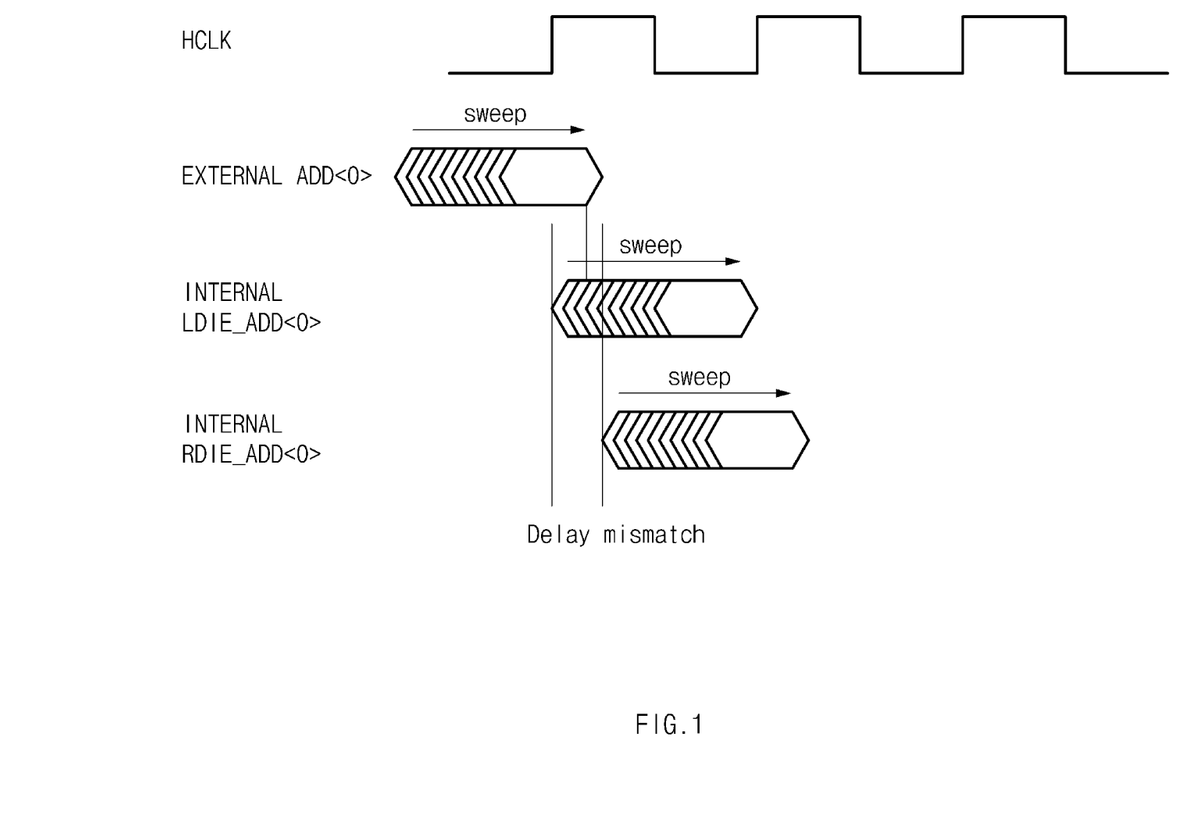
FIGS. 1 and 2 are representations of examples of diagrams to assist in the explanation of a training timing in a dual die package (DDP).
Figure 2:
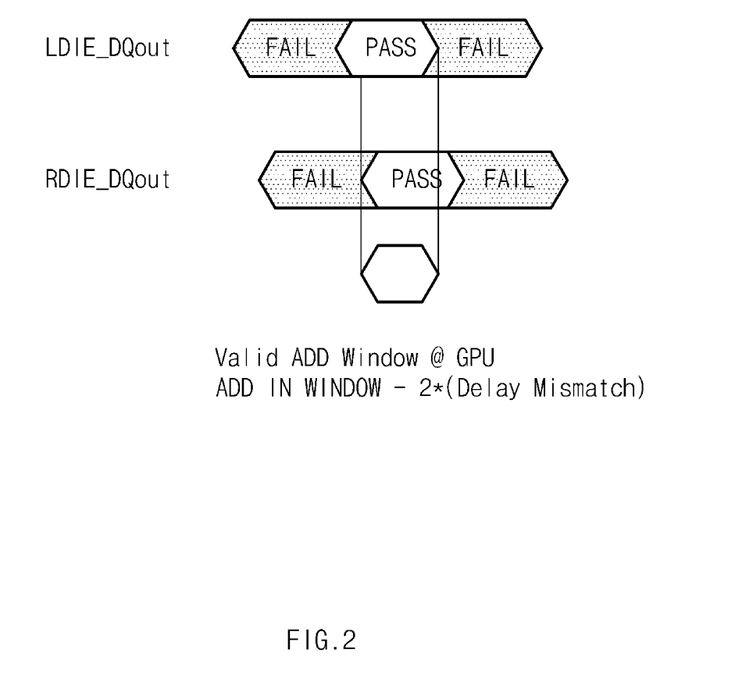

FIGS. 1 and 2 are representations of examples of diagrams to assist in the explanation of a training timing in a dual die package (DDP).

An external address ADD (i.e., EXTERNAL ADD<0>) of a semiconductor device may be inputted into two dies in synchronization with the rising edge and the falling edge of an external clock HCLK. The external clock HCLK may include a system clock received from an external controller. When a semiconductor package and a controller operating at a high speed transmit and receive addresses and command signals, a system clock may be used as a reference.

The two dies of a semiconductor package align setup/hold times by training the external address ADD applied from an exterior, as illustrated in FIG. 1.

By sweeping (i.e., sweep) the address timing of an internal address LDIE_ADD (i.e., LDIE_ADD<0>) inputted to one die LDIE of the dual die package, a setup/hold timing may be controlled. Further, by sweeping the address timing of an internal address RDIE_ADD (i.e., RDIE_ADD<0>) inputted to the other die RDIE of the dual die package, a setup/hold timing may be controlled.

However, the two dies of the semiconductor package are different in internal/external chip circumstances, that is, PVT (process, voltage and temperature) conditions. According to this fact, the delay times of the internal addresses LDIE_ADD and RDIE_ADD trained in the respective dies may be mismatch with each other (i.e., Delay mismatch).

Attributable to this fact, data LDIE_DQout to be outputted in correspondence to a corresponding address of the die LDIE and data RDIE_DQout to be outputted in correspondence to a corresponding address of the die RDIE may be outputted at different timings.

In these examples, as illustrated in FIG. 2, timings at which the output data LDIE_DQout and RDIE_DQout of the respective dies pass during a valid address window may be different from each other. Accordingly, in these examples of FIG. 2, an address timing satisfying the two dies LDIE and RDIE may not be secured (i.e., Valid ADD Window @ GPU ADD IN WINDOW−2*(Delay Mismatch), FAIL).

Figure 3:
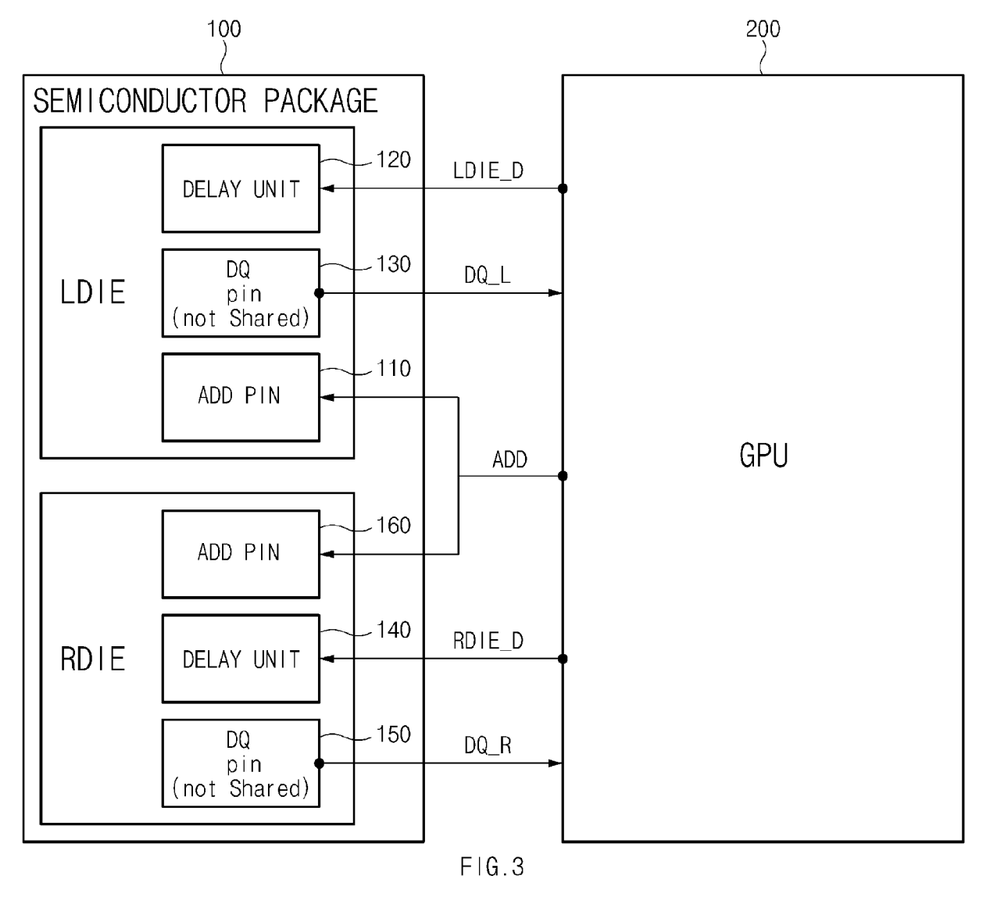
FIG. 3 is a configuration diagram illustrating a representation of an example of a semiconductor package in accordance with an embodiment.

FIG. 3 is a configuration diagram illustrating a representation of an example of a semiconductor package in accordance with an embodiment.

An embodiment may include a semiconductor package 100 and a controller for controlling the semiconductor package 100. The controller may include a graphic processing unit (GPU) 200 for professionally processing images.

The controller may perform the function of controlling or tuning a series of processes for receiving data from the semiconductor package 100, processing the received data and transmitting processing results to the semiconductor package 100.

Such a controller may be one of various processing devices such as, for example but not limited to, a central processing unit (CPU), a graphic processing unit (GPU), a digital signal processor (DSP), an application processor (AP), and so forth. With regards to an embodiment, it will be described as an example that the controller includes the graphic processing unit 200.

The semiconductor package 100 may include address pins 110 and 160 shared by a first die LDIE and a second die RDIE. The first die LDIE and the second die RDIE may be disposed adjacent to each other in the form of a stack, and may configure a multi-chip package (MCP).

The first die LDIE and the second die RDIE may receive one address ADD through the respective address pins 110 and 160 from the graphic processing unit 200. The semiconductor package 100 may be configured by a dual die package (DDP). The dual die package (DDP) may be formed as the first die LDIE and the second die RDIE are packaged into one.

The first die LDIE and the second die RDIE may include a plurality of data pads for performing communication with the graphic processing unit 200. The first die LDIE may include a delay unit 120 and a data pin 130 (i.e., DQ pin). The second die RDIE may include a delay unit 140 and a data pin 150 (DQ pin).

The delay unit 120 may receive a delay signal LDIE_D from the graphic processing unit 200 and may align the address timing of the first die LDIE. The data pin 130 may output data DQ_L matched with the address aligned by the delay unit 120, to the graphic processing unit 200. The graphic processing unit 200 may receive the data DQ_L corresponding to the address ADD, and may determine the address offset information of the first die LDIE.

The delay unit 140 may receive a delay signal RDIE_D from the graphic processing unit 200 and may align the address timing of the second die RDIE. The data pin 150 may output data DQ_R matched with the address aligned by the delay unit 140, to the graphic processing unit 200. The graphic processing unit 200 may receive the data DQ_R corresponding to the address ADD, and may determine the address offset information of the second die RDIE.

In an embodiment, the address delay amounts of the respective dies LDIE and RDIE are set by the delay units 120 and 140 to be the same with each other, before an address training operation, such that the address timings of the respective dies LDIE and RDIE are aligned with each other. In these examples, it may be possible to secure an address timing that satisfies both dies LDIE and RDIE.

Each of the dies LDIE and RDIE of the above-described semiconductor package 100 may be configured by at least one of, for example but not limited to, a capacitive memory such as a DRAM (dynamic random access memory) and an SRAM (static random access memory), a resistive memory such as a PRAM (phase change random access memory) and an RRAM (resistance random access memory), an NFGM (nano-floating gate memory), a PoRAM (polymer random access memory), an MRAM (magnetic random access memory), and an FRAM (ferroelectric random access memory).

Figure 4:
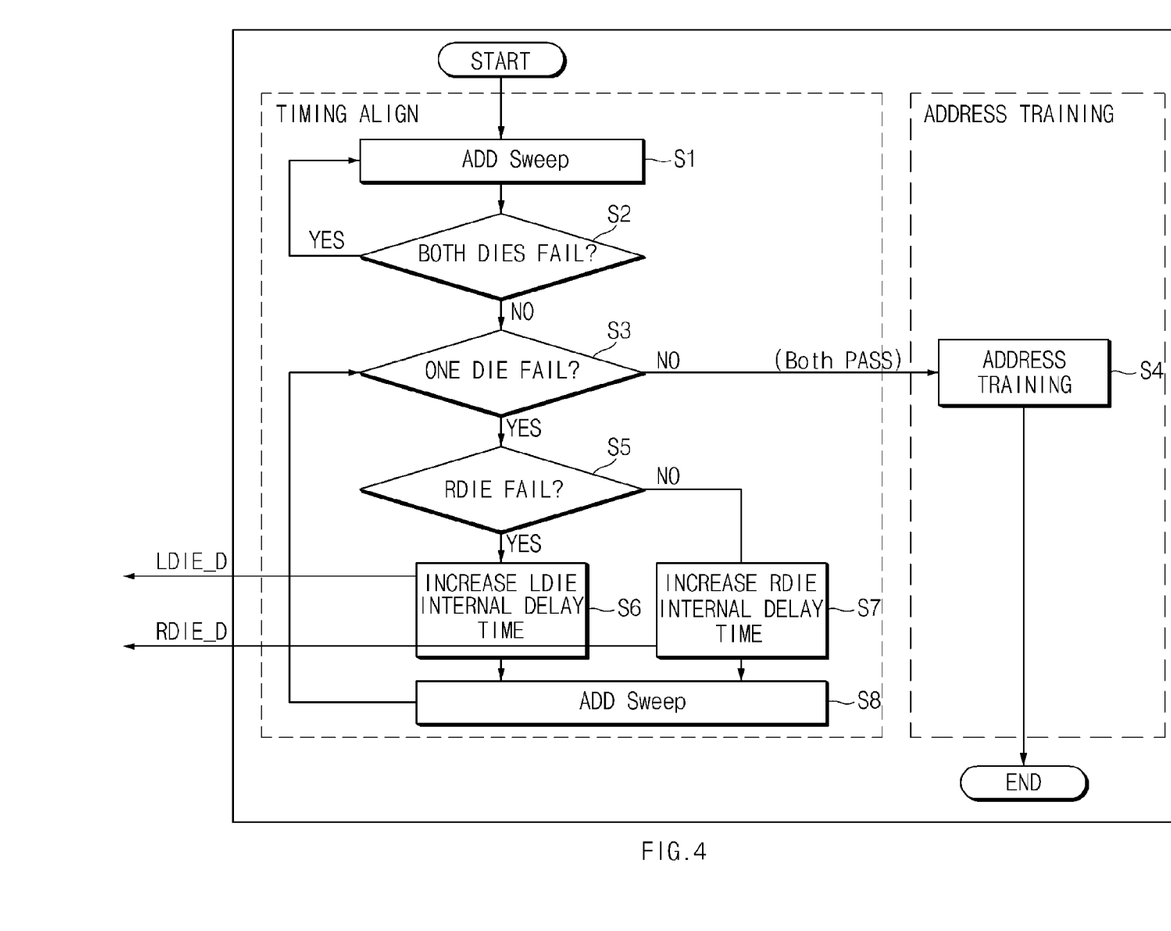
FIG. 4 is a representation of an example of a flow chart to assist in the explanation of a training method in accordance with an embodiment.

Operating processes for the graphic processing unit 200 in an embodiment configured as mentioned above will be described below with reference to the flow chart of FIG. 4.

When an operation is started, power is supplied to the semiconductor package 100, and the graphic processing unit 200 transmits one external address ADD to the respective dies LDIE and RDIE of the semiconductor package 100 (START).

The respective dies LDIE and RDIE receive the delay signals LDIE_D and RDIE_D from the graphic processing unit 200, and sweep the address ADD based on the clock HCLK (51).

Thereafter, the graphic processing unit 200 determines whether both dies LDIE and RDIE have failed, by determining whether the data DQ_L and DQ_R applied from the semiconductor package 100 are aligned within a valid window (S2).

If it is determined that both dies LDIE and RDIE have failed (i.e., YES), timings are controlled by sweeping the address. Then, it is determined whether only one die of the two dies LDIE and RDIE has failed (S3).

The graphic processing unit 200 performs an address training operation in the examples where both data DQ_L and DQ_R applied from the semiconductor package 100 have passed within the valid window (S4).

In a system operating at a high speed, the valid window of data cannot help but gradually decrease. As the data existing in the channel between the semiconductor package 100 and the graphic processing unit 200 increases, the operation time of data and the transition time of a clock may mismatch with each other, and thus, erroneous data may be received.

Therefore, in order for a semiconductor package operating at a high speed to operate normally, an interface training operation should be performed between the semiconductor package 100 and the graphic processing unit 200 at an initial operation stage.

The interface training means to perform training before a normal operation is performed between the semiconductor package 100 and the graphic processing unit 200, such that an interface for transferring a command, the address ADD and the data DQ_L and DQ_R is optimized.

Such interface training is divided into address training, clock alignment training (WCK2CK training), read training, and write training. Among them, the clock alignment training (WCK2CK training) means to perform an operation for aligning a data clock and a system clock.

Afterwards, the graphic processing unit 200 determines whether one die of the two dies LDIE and RDIE, for example, the second die RDIE has failed (S5).

In the examples where the second die RDIE has failed, the delay signal LDIE_D is outputted to the delay unit 120 of the first die LDIE. According to this fact, the internal delay time of the first die LDIE is increased by one step (S6). The first die LDIE controls the delay timing of an internal address LDIE_ADD in correspondence to the delay signal LDIE_D (S8).

Conversely, in the examples where the second die RDIE has not failed, the delay signal RDIE_D is outputted to the delay unit 140 of the second die RDIE. According to this fact, the internal delay time of the second die RDIE is increased by one step (S7). The second die RDIE controls the delay timing of an internal address RDIE_ADD in correspondence to the delay signal RDIE_D (S8).

In this way, in an embodiment, an address timing aligning operation is performed for one die of the respective dies LDIE and RDIE, and an offset value (whether data has passed/failed within the valid address window) is transmitted to the graphic processing unit 200. Then, an address timing aligning operation is performed for the remaining one die, and an offset value is transmitted to the graphic processing unit 200.

Next, the graphic processing unit 200 aligns the address timings of the respective dies LDIE and RDIE in consideration of the difference between the offset values transmitted from the respective dies LDIE and RDIE. After controlling the offset values of the respective dies LDIE and RDIE to be the same, the address training operation is performed.

That is to say, in an embodiment, after internal address timings are aligned in the respective dies LDIE and RDIE of the semiconductor package 100, the graphic processing unit 200 performs the address training to determine delay amounts of the address timings in the respective dies LDIE and RDIE.

Namely, at an initial operating stage of a semiconductor package, an operation for finding an optical address timing at which a sufficient setup/hold time is secured is performed based on the clock HCLK.

Figure 5:
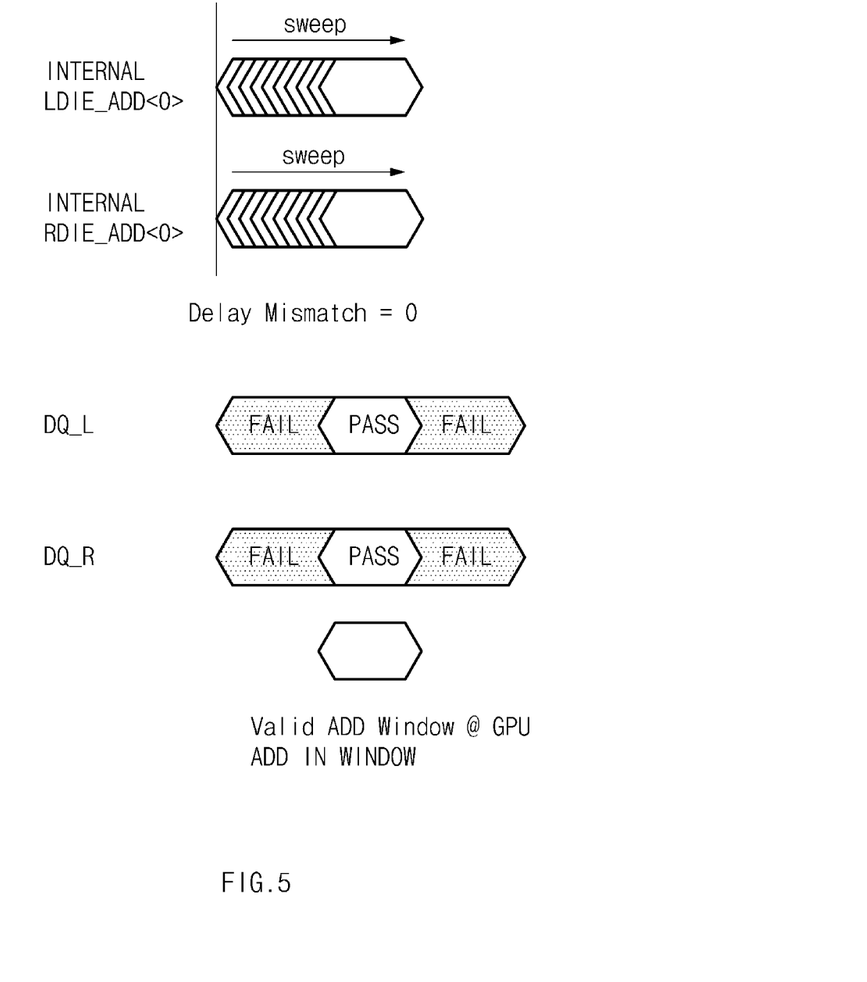
FIG. 5 is a representation of an example of a diagram to assist in the explanation of a training timing in a dual die package (DDP) in accordance with an embodiment.

FIG. 5 is a representation of an example of a diagram to assist in the explanation of a training timing in a dual die package (DDP) in accordance with an embodiment.

One address ADD is inputted to the respective address pins 110 and 160 of the semiconductor package 100 from the graphic processing unit 200 (See FIG. 3).

Since the first die LDIE and the second die RDIE of the semiconductor package 100 are configured by two chips, PVT (process, voltage and temperature) conditions of the respective dies LDIE and RDIE may be different.

Therefore, even though the first die LDIE and the second die RDIE receive one address ADD, delay amounts by which the internal addresses LDIE_ADD and RDIE_ADD are delayed in the respective dies LDIE and RDIE may become different according to PVT variations.

If the internal addresses LDIE_ADD and RDIE_ADD (i.e., LDIE_ADD<0> and RDIE_ADD<0>) are not aligned in the respective dies LDIE and RDIE, it is meant that a reference for transferring an address and a reference for transferring data are not aligned. This means that a semiconductor package operating at a high speed may not operate normally.

However, in an embodiment, address delay times different in respective dies are aligned in advance before performing the address training (i.e., Delay Mismatch=0). According to this fact, periods in which the data DQ_L and DQ_R have passed within the valid window of the address ADD in the respective dies LDIE and RDIE may precisely match with each other (i.e., Valid ADD Window @ GPU ADD IN WINDOW, PASS).

The semiconductor packages and semiconductor systems discussed above (see FIGS. 1-5) are particular useful in the design of memory devices, processors, and computer systems. For example, referring to FIG. 6, a block diagram of a system employing the semiconductor packages and semiconductor systems in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 6:
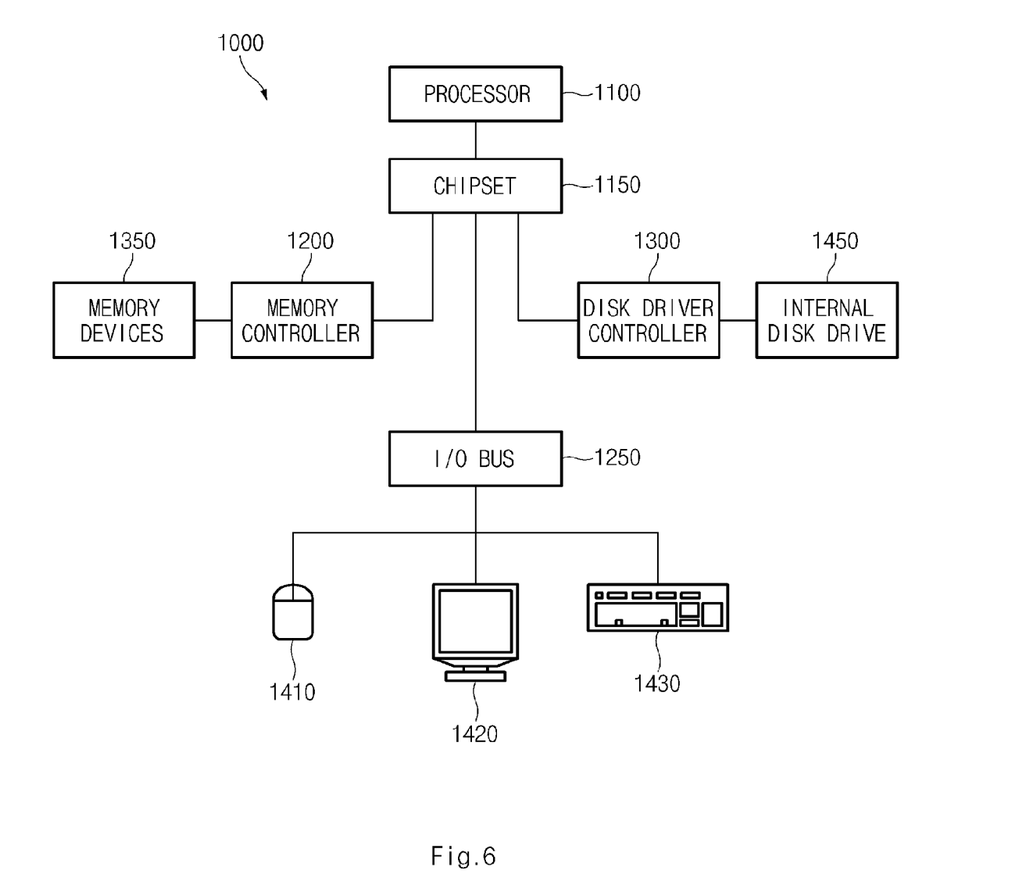
FIG. 6 illustrates a block diagram of an example of a representation of a system employing the semiconductor package and a semiconductor system in accordance with the embodiments discussed above with relation to FIGS. 1-5.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one controller 200 and/or semiconductor package 100 and/or semiconductor system as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one controller 200 and/or semiconductor package 100 and/or semiconductor system as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor packages and semiconductor systems as discussed above with relation to FIGS. 1-5. In alternate embodiments, such as cellular phones or digital cameras, the components may differ from the embodiments illustrated in FIG. 6.

While various embodiments have been described above, it will be understood to those skilled in the art that the embodiments described are by way of example only. Accordingly, the semiconductor package and the semiconductor system including the same described herein should not be limited based on the described embodiments.

What is claimed is:

1. A semiconductor package comprising:
   a first die;
   a second die disposed adjacent to the first die, and configured to share an address with the first die;
   a first address pin included with the first die, and configured for receiving the address; and
   a second address pin included with the second die, and configured for receiving the address,
   wherein the first die and the second die output data corresponding to the address, and timings of the address in the first die and the second die are aligned within a valid window of the address according to delay signals received by the semiconductor package from a controller,
   wherein a delay amount of the delay signals is controlled by address offset information in the first die and the second die.

2. The semiconductor package according to claim 1, wherein the first die comprises:
   a first delay unit configured to delay the timing of the address according to a first delay signal applied from the controller; and
   a first data pin configured to output first data corresponding to the address, to the controller.

3. The semiconductor package according to claim 1, wherein the second die comprises:
   a second delay unit configured to delay the timing of the address according to a second delay signal applied from the controller; and
   a second data pin configured to output second data corresponding to the address, to the controller.

4. The semiconductor package according to claim 1, wherein the first die and the second die are aligned with the timings of the address, prior to an address training operation being performed.

5. The semiconductor package according to claim 1, wherein the timings of the address in the first die and the second die are aligned to be the same with each other.

6. The semiconductor package according to claim 1, wherein any one die of the first die and the second die is selected first, and the timing of the address is aligned.

7. A semiconductor system comprising:
   a semiconductor package including a first die and a second die, the first die and the second die configured to output data corresponding to an address and share the address; and
   a controller configured to output the address to the semiconductor package, receive the data, and output delay signals for aligning address timings of the first die and the second die,
   wherein the second die is disposed adjacent to the first die,
   wherein the controller aligns the address timings by determining whether the data has passed or failed, within a valid window of the address.

8. The semiconductor package according to claim 7, wherein the first die comprises:
   a first address pin included with the first die, and configured for receiving the address;
   a first delay unit configured to delay the address timing according to a first delay signal applied from the controller; and
   a first data pin configured to output first data corresponding to the address, to the controller.

9. The semiconductor package according to claim 7, wherein the second die comprises:
- a second address pin included with the second die, and configured for receiving the address;
- a second delay unit configured to delay the address timing according to a second delay signal applied from the controller; and
- a second data pin configured to output second data corresponding to the address, to the controller.

10. The semiconductor package according to claim 7, wherein the controller aligns the address timings prior to an address training operation being performed.

11. The semiconductor package according to claim 7, wherein the controller aligns the address timings of the first die and the second die to be the same with each other.

12. The semiconductor package according to claim 7, wherein the controller comprises a graphic processing unit (GPU).

13. The semiconductor package according to claim 7, wherein the controller selects any one die of the first die and the second die, and aligns the address timing.

14. The semiconductor package according to claim 7, wherein, when the address timings are aligned and both data of the first die and the second die have passed, the controller performs the address training operation.

15. The semiconductor package according to claim 7, wherein, when any one of the first die and the second die has failed, the controller controls the address timing by increasing a delay timing.

16. The semiconductor package according to claim 15, wherein, when the first die has failed, the controller increases the address timing of the first die by one step.

17. The semiconductor package according to claim 15, wherein, when the second die has failed, the controller increases the address timing of the second die by one step.

* * * * *